United States Patent

[11] 3,604,989

[72] Inventors Yuichi Haneta; Toshio Wada, both of Tokyo, Japan
[21] Appl. No. 864,995
[22] Filed Oct. 9, 1969
[45] Patented Sept. 14, 1971
[73] Assignee Nippon Electric Company Limited Tokyo, Japan
[32] Priority Oct. 11, 1968
[33] Japan
[31] 43/74355

[54] STRUCTURE FOR RIGIDLY MOUNTING A SEMICONDUCTOR CHIP ON A LEAD-OUT BASE PLATE
3 Claims, 4 Drawing Figs.

[52] U.S. Cl. .... 317/234 R, 317/235 R, 317/234 N, 317/235 D, 317/101 A
[51] Int. Cl. .... H01l 1/14
[50] Field of Search .... 317/234, 22, 101, 101 C, 101 A, 101 CC, 101 CM

[56] References Cited

UNITED STATES PATENTS

| | | | |
|---|---|---|---|
| 3,372,070 | 3/1968 | Zuk | 148/186 |
| 3,496,634 | 2/1970 | Kurtz et al. | 29/624 |
| 3,447,038 | 5/1969 | Liben | 317/101 |
| 3,419,955 | 1/1969 | Schutze et al. | 29/577 |
| 3,444,617 | 5/1969 | Stricker et al. | 29/626 |

*Primary Examiner*—John W. Huckert
*Assistant Examiner*—B. Estrin
*Attorney*—Sandoe, Hopgood and Calimafde

ABSTRACT: A semiconductor wiring unit is formed by passing conducting needles projecting from a stem plate through apertures formed in the wiring layers of a semiconductor chip. The apertures are located in registration with the needles. After insertion in the apertures the needles are soldered to the wiring layers.

*INVENTORS*
Yuichi Haneta
Toshio Wada
*by*
Sandoe, Hopgood & Calimafde
ATTORNEYS

STRUCTURE FOR RIGIDLY MOUNTING A SEMICONDUCTOR CHIP ON A LEAD-OUT BASE PLATE

This invention relates to a wiring structure for a semiconductor device in which at least one semiconductor chip is rigidly mounted on a leadout baseplate.

In a conventional semiconductor device, the electrode leadout portions are commonly connected to the stem lead or to the wiring baseplate by the use of a fine lead, solder bead, beam lead, or the like. The use of the fine lead results in low production efficiency and the reliability of the contact at each point of connection is not very high. Therefore, an electrode connection produced by the thin lead is not suited for an element such as a semiconductor integrated circuit having many electrode leadout portions. The solder-bead method and the beam-lead method, also known as the face-bonding method, may have a higher production efficiency and reliability than the fine-lead method. In the solder-bead method, however, it is difficult to fuse the solder uniformly in specific portions with a high accuracy. In the beam-lead method, it is necessary to initially prepare the beam-lead chips which are formed of laminated metallic layers by resorting to a series of complicated process.

An object of this invention is therefore to provide a highly reliable semiconductor device, which can be manufactured by a simple process.

According to this invention, there is provided a semiconductor device with a specific type of wiring structure, which comprises: a semiconductor chip having the necessary number of circuit elements incorporated in a common semiconductor substrate, and conductive wiring layers disposed on one major surface of that surface. Ends of the wiring layers extend toward the periphery of the semiconductor substrate and have at their extended end portions apertures which penetrate through the chip. A stem plate includes conductive needles at positions corresponding to the locations of the apertures in the chip. The stem plate and the semiconductor chip are united to form a unitary winding structure by inserting the conductive needles inserted into the apertures and soldering the needles to the conductive wiring layers.

In the semiconductor device of this invention the semiconductor chip can be rigidly mounted on the stem plate and the electrodes can be readily led out from the unit, thereby to realize high reliability of the electrode lead connections.

The present invention will be described in detail in conjunction with the accompanying drawings: in which all the figures illustrate a preferred embodiment of this invention, more specifically:

Figure 1:
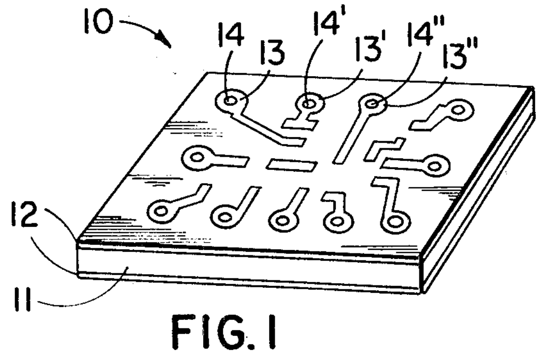
FIGS. 1 and 2 are perspective views of a semiconductor chip and a stem plate, respectively.
Figure 2:
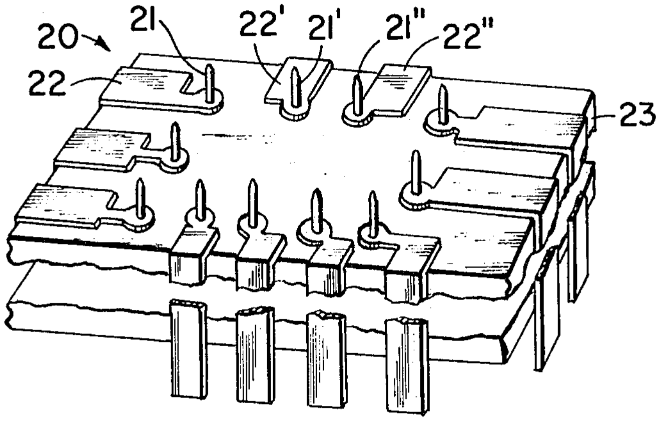

Referring to FIGS. 1 and 2, the preferred embodiment of this invention comprises a semiconductor chip 10 and a leadout stem plate 20. The semiconductor chip 10 consists of a semiconductor substrate 11 in which the necessary members of circuit elements are formed. An insulation films is 12 adherent to the upper and lower main surfaces of the substrate 11 for protecting the latter, and wiring layers such as 13, 13', and 13'' are formed on one surface of the upper insulation film. Chips 10 also has a plurality of apertures such as 14 and 14' at the end portions of each of the wiring layers 13. Stem plate 20 has a plurality of conductor needles such as 21, 21' and 21'' protruding upwardly from positions corresponding to the locations of the apertures in the semiconductor substrate

11 of the chip 10. Each of the needles 21 may be firmly attached through a chemical etching or electron beam process to a plurality of external conductor strips such as 22, 22' and 22'' which are in turn bonded to the surface of an insulation plate 23. The diameters of the conductor needles 21 is determined to be received in and through the apertures 14, 14', etc.

Figure 3:
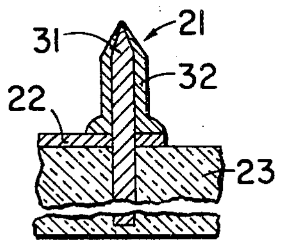
FIG. 3 is a partial cross-sectional view of the stem plate.
Figure 4:
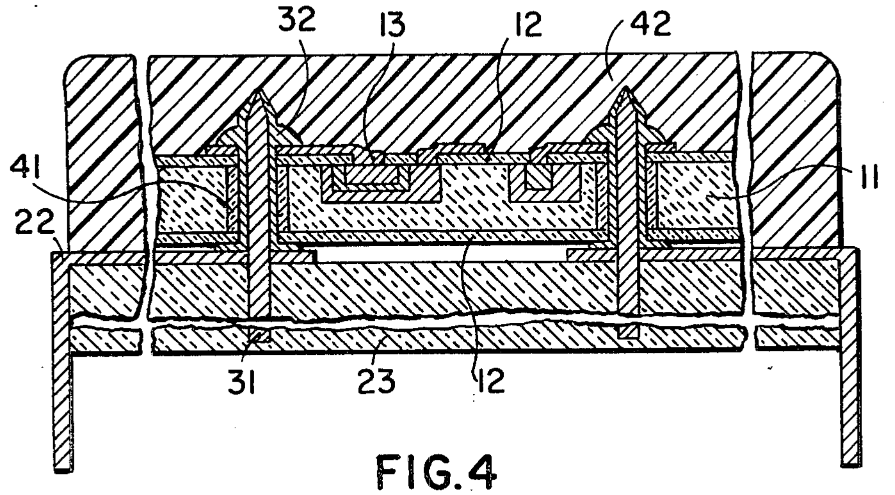
FIG. 4 is a cross-sectional view of the embodiment in its completed state.

As shown in FIG. 3, each conductive needle 21 consists of a core part 31 of a hard metal securely buried in the insulation plate 23, and covered with a low-melting-point soft-metal layer 32 suited for soldering. Core part 31 may be made, for example, of an iron-nickel-cobalt alloy, tungsten, or molybdenum, and is preferably of about 0.05 to 0.5 mm. in diameter. The metal layer 32 is made of a low-melting-point metal such as gold, tin, lead, and silver. The core part 31 and the external strip 22 are welded at the same time to the metal layer 32. To form the completed unit, semiconductor chip 10 is firmly affixed on stem plate 20 with the needles 21, being inserted into the respective apertures 14 in chip 10. After engaging the needles with the apertures, the top portion of each of the needles is heated to effect the soldering or brazing by the layer 32. As seen in FIG. 4, chip 10 becomes firmly fixed on stem plate 20 by the needles 21, 21' kept in firm connection with wiring layers 13, through the apertures 14.

As shown in FIG. 4, each of the conductor needles 21 in the completed unit is insulated from the silicon substrate 11 by means of a silicon dioxide film 41 formed through a thermal oxidation over the surface and aperture portion of the substrate 11. After the electrode leadout process is completed, the semiconductor chip is hermetically sealed on one main surface of the stem plate by an insulator film 42 which may be formed of such material as synthetic resin ceramic, or glass.

In the above embodiment, the conductive needle 21, 21', 21'' .... may also be connected to the wiring layers 13 by external soldering. For insulating the conductive needles 21, 21', 21'' .... from one another, impurities of different conductivity type from that of the semiconductor substrate 11 may be diffused into the substrate 11 through the apertures 14. Alternatively the side surface of the conductive needles 21, may be coated with an insulation material.

While a preferred embodiment of the invention has been described, it is particularly understood that the invention is not limited thereto.

What is claimed is:

1. A semiconductor device comprising a stem plate having a plurality of conductive needles projecting substantially perpendicularly from one main surface thereof; a semiconductor chip having apertures provided therethrough in the direction of the thickness thereof to admit said needles in one-to-one correspondence, said needles respectively extending through said apertures, an insulator film covering one main surface of said semiconductor chip, a plurality of circuit elements formed in said chip, a plurality of wiring conductor strips formed on said insulator film and electrically connected to said circuit elements and extending to said apertures; means for electrically connecting the free ends of said needles to said conducting strips, means for insulating said needles from said semiconductor chip, and wiring means bonded to said stem plate and connected respectively to said needles.

2. The semiconductor of claim 1, in which said stem plate comprises an insulating base, each of said needles comprising a core portion having a lower part embedded in said base, said electrical connecting means including a layer of soldering material disposed over the projecting upper part thereof.

3. The semiconductor device of claim 1, in which said insulating means comprises an insulating material formed on the surfaces of said apertures.